United States Patent [19]

Taniji

[11] Patent Number: 4,985,776
[45] Date of Patent: Jan. 15, 1991

[54] METHOD OF DRIVING SOLID-STATE IMAGING ELEMENT

[75] Inventor: Yukio Taniji, Tokyo, Japan

[73] Assignee: NEC Corporation, Tokyo, Japan

[21] Appl. No.: 440,167

[22] Filed: Nov. 22, 1989

[30] Foreign Application Priority Data

Nov. 22, 1988 [JP] Japan .................. 63-296660

[51] Int. Cl.[5] .................. H04N 3/14; H04N 5/335
[52] U.S. Cl. .................. 358/213.23; 358/213.11; 358/213.13; 358/213.31
[58] Field of Search .................. 358/213.11, 213.12, 358/213.13, 213.14, 213.15, 213.16, 213.17, 213.18, 213.19, 213.22, 213.23, 213.24, 213.25, 213.26, 213.27, 213.28, 213.29, 213.31

[56] References Cited

U.S. PATENT DOCUMENTS

| | | | |
|---|---|---|---|
| 4,302,779 | 11/1981 | Inoue . | |
| 4,788,592 | 11/1988 | Yamawaki et al. | 358/213.15 |
| 4,809,073 | 2/1989 | Chiba et al. | 358/213.13 |
| 4,816,916 | 3/1989 | Akiyama | 358/213.29 |
| 4,884,142 | 11/1989 | Suzuki | 358/213.19 |

Primary Examiner—Howard W. Britton
Assistant Examiner—Michael H. Lee
Attorney, Agent, or Firm—Sughrue, Mion, Zinn, Macpeak & Seas

[57] ABSTRACT

In a method of driving a solid-state imaging element, an operation of reading charges from a photoelectric conversion element to a vertical transfer register of an imaging region and an operation of clearing charges by discharging them to an overflow drain are performed plurality of time within one field period.

1 Claim, 5 Drawing Sheets

METHOD OF DRIVING SOLID-STATE IMAGING ELEMENT

BACKGROUND OF THE INVENTION

The present invention relates to a method of driving a solid-state imaging element such as a CCD and, more particularly, to a method of controlling the exposure amount of a solid state imaging device using a solid-state imaging element.

Conventional methods of controlling the exposure amount of not only solid-state imaging devices but also other imaging devices have been realized by a combination of control of the aperture of a lens and of a shutter speed. In a video camera, its shutter speed is determined by the field frequency of the television format. For example, in the NTSC format, the shutter speed is 1/60 seconds. Therefore, the aperture is adjusted in accordance with changes in incident light amount so as to optimize the exposure amount. In addition, in order to adjust the exposure amount of a device, other techniques are employed, e.g., changing the gain of a camera or inserting an ND filter in front of a lens. As solid state imaging elements have been increasingly used in practical applications, various driving methods have been developed. Especially, an electronic shutter is designed to increase the dynamic resolution by discharging some of charges generated by photoelectric conversion to the drain. With this shutter, exposure amount control is also realized.

FIG. 6 shows a structure of a device which realizes an electronic shutter. FIG. 7 shows changes in the amount of charges accumulated in a photoelectric conversion element 1 as a function of time. Incident light is photoelectrically converted by the photoelectric conversion element, and the resultant charges are accumulated. More specifically, if light is incident with the same intensity for an interval of one field, the amount of charges is linearly increased from $t_0$ to $t_2$, as shown in FIG. 7. If, however, a pulse is applied to an overflow control gate electrode at a given timing $t_1$ so as to discharge the charges of the photoelectric conversion element 1 to an overflow drain 7 and to clear them, an output at a timing when the charges are transferred to a vertical transfer register 2, i.e., at the timing $t_2$, can be set to be $(t_2-t_1)/(t_2-t_0)$ of one normal operation.

That is, by equivalently setting the interval between $t_1$ and $t_2$ as a charge storage time, a shutter operation capable of increasing the dynamic resolution can be realized, and adjustment of an exposure amount can also be performed.

In the method of controlling the exposure amount by this shutter operation, the dynamic resolution is increased. However, since a picture is intermittently generated every 1/60 seconds due to the limitations of a television format, especially when a high shutter speed is set, the shutter operation becomes discontinuous, involving a sense of awkwardness.

SUMMARY OF THE INVENTION

It is, therefore, an object of the present invention to provide a method of driving a solid-state imaging element, which can control an exposure amount without provoking a sense of awkwardness.

In order to achieve the above object, according to the invention, there is provided a method of driving a solid-state imaging element which includes an imaging region having a photoelectric conversion element, a readout gate adjacent thereto, a vertical transfer register, and an overflow drain which are formed on a single semiconductor substrate, and a storage region having a vertical transfer register and a horizontal transfer register, the vertical transfer registers of the imaging and storage regions being allowed to be independently driven by different application pulses, and the overflow drain formed in the imaging region being capable of performing a clear operation of charges, wherein an operation of transferring charges from the photoelectric conversion element to the vertical transfer register of the imaging region and an operation of clearing charges by discharging the charges to the overflow drain are performed plurality of time within one field period.

DETAILED DESCRIPTION OF THE PREFERRED EMBODIMENTS

The present invention will be described below with reference to the accompanying drawings.

Figure 1:
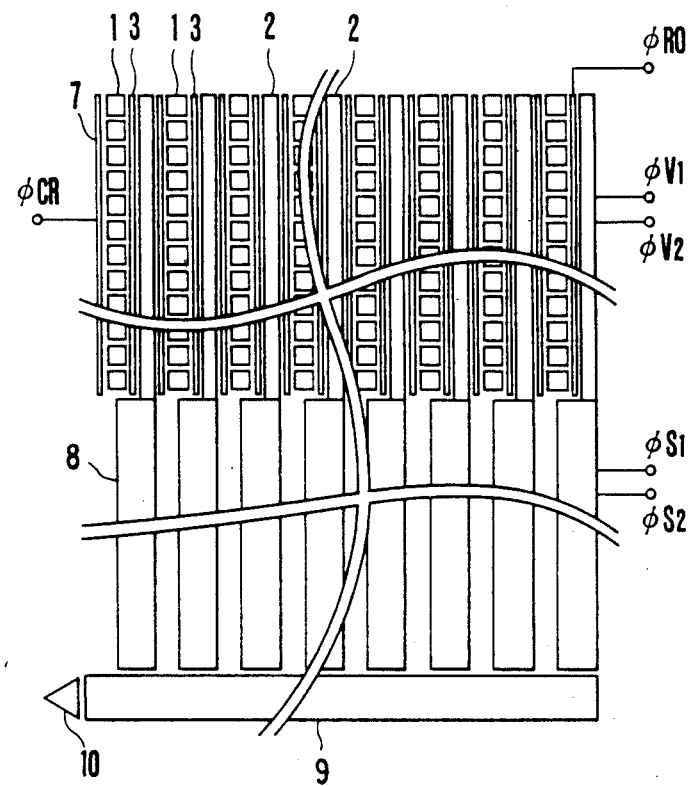
FIG. 1 is a plan view showing a solid-state imaging element used in a method of driving a solid-state imaging element according to an embodiment of the present invention.
Figure 2:
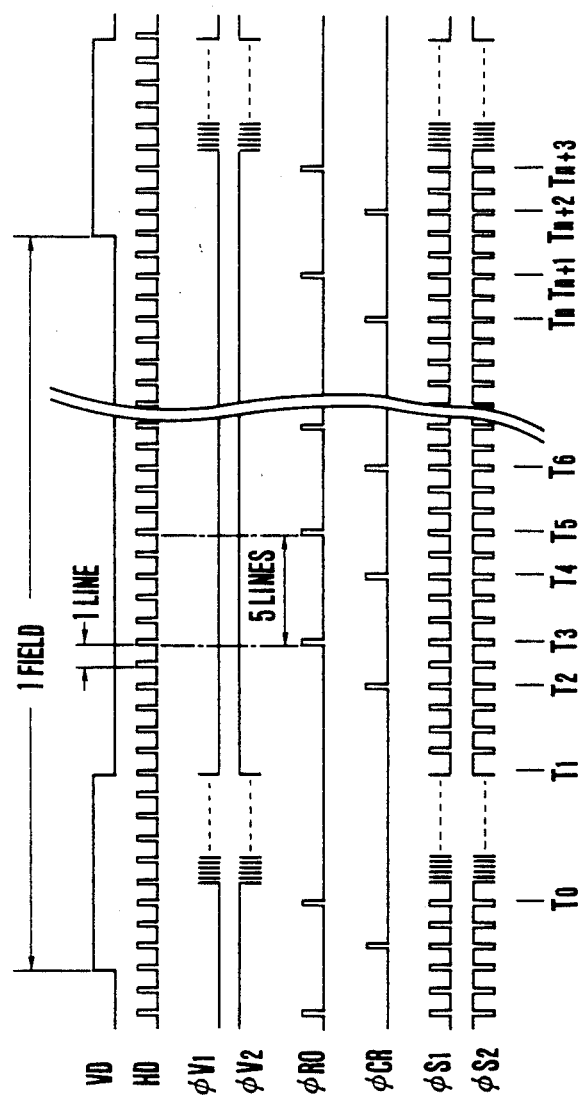
FIG. 2 is a timing chart of a driving operation of the element.
Figure 6:
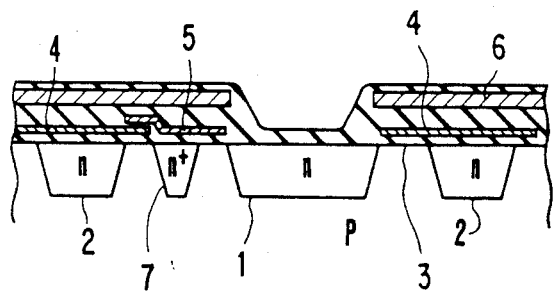
FIG. 6 is a sectional view showing a structure of a conventional photoelectric conversion element having an overflow drain structure.
Figure 7:
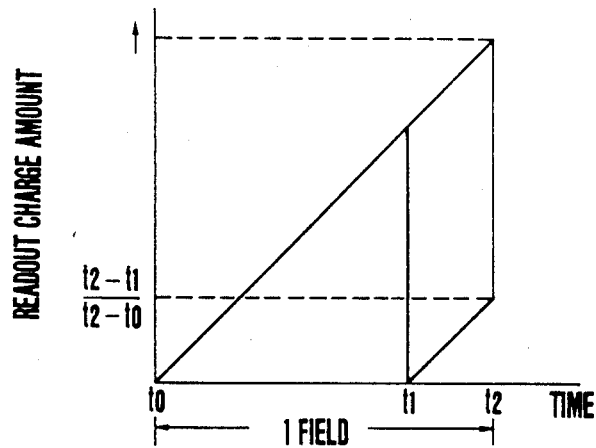
FIG. 7 is a graph, showing changes in storage charge amount, for explaining a conventional shutter operation.

FIG. 1 shows an arrangement of a solid-state imaging element to which a driving method of the present invention can be applied. FIG. 2 is a timing chart of driving the element having the structure shown in FIG. 1 according to the present invention. The solid-state imaging element shown in FIG. 1 is a frame interline type solid-state imaging element which is generally used. The components of the element are respectively denoted by reference numerals in accordance with those in FIG. 6. After a vertical transfer register 2 of an imaging section of the element is operated during an interval between $T_0$ and $T_1$ by using transfer pulses $\phi V_1$ and $\phi V_2$ shown in FIG. 2, the operation of the element is stopped. Each of these transfer pulses has, for example, a frequency of 600 to 700 kHz and a duty ratio of 50%. The charges which are read out a plurality of times by a readout pulse $\phi RO$ are sequentially added together in the vertical transfer register 2. Therefore, if the sequentially accumulated charges can be controlled within a period corresponding to a pulse interval in which the readout pulse $\phi RO$ is applied, this control amount can directly determine the exposure amount. In this embodiment, this pulse interval is set to correspond to five lines, and the amount of charges which are accumulated after the readout pulse $\phi RO$ is applied is cleared and controlled by applying a clear pulse $\phi$CR (FIG. 2). More specifically, the clear pulse $\phi$CR is applied at a timing $T_4$ in an interval of five lines between $T_3$ and $T_5$ so as to set an effective exposure period to correspond to the period from $T_4$ to $T_5$. Therefore, the exposure amount can be arbitrarily adjusted by advancing/delaying the application timings of the clear pulses $\phi$CR.

Figure 3:
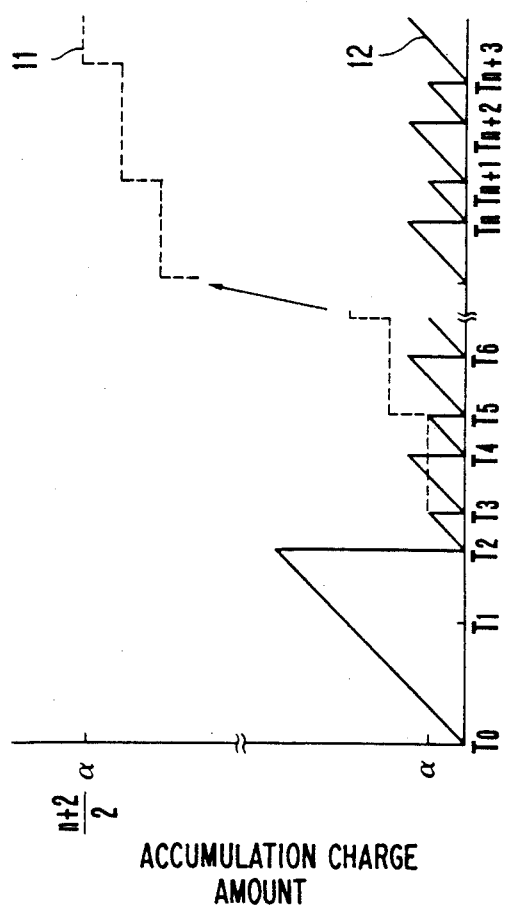
FIG. 3 is a graph showing changes in storage charge amount in the driving method according to the embodiment of the present invention.

FIG. 3 shows, with solid and dotted lines, changes in storage charge amount of the photoelectric conversion element and of the vertical transfer register as a function time. The storage charge amount is increased by $\alpha$ by readout operations at $T_3$, $T_5$, .... As is apparent from FIG. 3, a charge amount $\alpha$ per one readout operation is determined by a ratio of the pulse interval of $\phi$RO to that of $\phi$CR.

According to this method, since some video data is always obtained every five-line period, images are not intermittently produced as in exposure control by means of a shutter operation, and proper exposure control can be performed at a shutter speed based on a television format.

In this embodiment, the control interval is set to correspond to five lines. However, this interval can be changed in accordance with the application purpose of a camera or the like. In addition, in order to prevent pulse noise in an image, a pulse may be applied within a horizontal blanking period. It is obvious that a constant exposure amount per one readout operation need not be set as long as the total exposure amount in one field is controlled to be constant.

Figure 4:
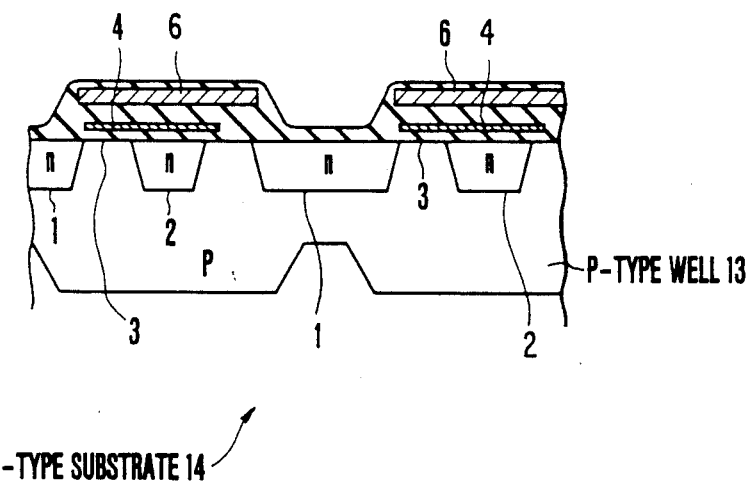
FIG. 4 is a sectional view showing a structure of a photoelectric conversion element which can be applied to another embodiment of the present invention.
Figure 5:
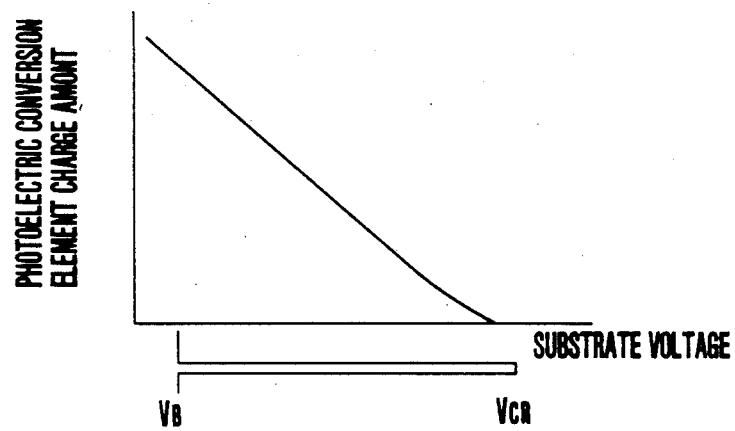
FIG. 5 is a graph showing changes in photoelectric conversion element (FIG. 4) charge amount as a function of substrate voltage.

FIG. 4 shows a sectional structure of a photoelectric conversion element to which another driving method of the present invention can be applied. A photoelectric conversion element 1 is formed in a p-type well 13 on an n type substrate 14 so as to constitute a vertical type overflow drain structure. The photoelectric conversion element 1 and a vertical transfer register 2 are arranged in the p-type well 13, and a transfer electrode 4 and a light-shielding layer 6 of the vertical transfer register 2 are formed on the substrate 14. A region 3 under the transfer electrode 4 is a readout gate portion. In this structure, as shown in FIG. 5, the storage charge amount of the photoelectric conversion element can be cleared by adding a clear pulse having a maximum voltage $V_{CR}$ to a normal blooming control voltage $V_B$. Therefore, exposure control can be performed by the method of the present invention in the same manner as described with reference to FIG. 2. This embodiment does not require the overflow drain 7, and hence is advantageous in terms of sensitivity and the like.

As has been described above, according to the present invention, in a frame interline transfer type solid state imaging element having an overflow drain structure, exposure control with a less sense of awkwardness as compared with control by a shutter operation can be realized by performing, a plurality of times, an operation of transferring charges to a vertical register and a clear operation of charges in a photoelectric conversion element.

What is claimed is:

1. A method of driving a solid-state imaging element which includes a semiconductor substrate formed of a first type of semiconductor material, and a well, of a second, different type of semiconductor material, formed on said semiconductor substrate, said imaging element further including an imaging region having a photoelectric conversion element formed in said well so as to provide a vertical-type overflow drain structure without a separately-formed overflow drain, a readout gate adjacent thereto, a vertical transfer register, and a storage region having a vertical transfer register and a horizontal transfer register, said method comprising the steps of:

driving said vertical transfer registers of said imaging and storage regions independently by different application pulses, said vertical-type overflow drain structure formed in said imaging region performing a clear operation of charges; and performing an operation of transferring charges from said photoelectric conversion element to said vertical transfer register of said imaging region and an operation of clearing charges by discharging the charges to said vertical-type overflow drain structure a plurality of times within one field period.

* * * * *